(12) United States Patent
Holland et al.

(10) Patent No.: US 8,866,113 B2
(45) Date of Patent: Oct. 21, 2014

(54) ELECTRICAL ISOLATOR CIRCUIT

(75) Inventors: William Michael James Holland, Edinburgh (GB); Jonathan Ephraim David Hurwitz, Edinburgh (GB); Iain Barnett, Lasswade (GB)

(73) Assignee: Broadcom Corporation, Irvine, CA (US)

( * ) Notice: Subject to any disclaimer, the term of this patent is extended or adjusted under 35 U.S.C. 154(b) by 284 days.

(21) Appl. No.: 13/498,076

(22) PCT Filed: Sep. 23, 2010

(86) PCT No.: PCT/GB2010/051597
§ 371 (c)(1),
(2), (4) Date: Mar. 30, 2012

(87) PCT Pub. No.: WO2011/036489
PCT Pub. Date: Mar. 31, 2011

(65) Prior Publication Data
US 2012/0175504 A1    Jul. 12, 2012

(30) Foreign Application Priority Data
Sep. 24, 2009    (GB) .................................. 0916762.8

(51) Int. Cl.
G02B 27/00    (2006.01)
H04B 10/80    (2013.01)
H03K 17/78    (2006.01)

(52) U.S. Cl.
CPC .............. *H04B 10/802* (2013.01); *H03K 17/78* (2013.01)
USPC ........................................................ 250/551

(58) Field of Classification Search
CPC ............. H03K 17/78–17/7955; H04B 10/801; H04B 10/802; H01L 31/12; H01L 31/16; H01L 31/167

USPC ........................................................ 250/551
See application file for complete search history.

(56) References Cited

U.S. PATENT DOCUMENTS

| 5,382,786 A | 1/1995 | Lovelace |
| 5,734,170 A * | 3/1998 | Ikeda ............................ 250/551 |
| 2002/0155670 A1 * | 10/2002 | Malik ............................ 438/312 |
| 2004/0011973 A1 * | 1/2004 | Dodson, III ................... 250/551 |

FOREIGN PATENT DOCUMENTS

| FR | 2724797 A1 | 3/1996 |
| WO | 98/33285 A1 | 7/1998 |

OTHER PUBLICATIONS

International Search Report, International Application No. PCT/GB2010/051597, Feb. 2, 2011, 3 pages.

* cited by examiner

*Primary Examiner* — Thanh Luu
*Assistant Examiner* — Renee D Chavez
(74) *Attorney, Agent, or Firm* — Garlick & Markison; Bruce E. Garlick (57) ABSTRACT

The invention discloses an electrical isolator circuit comprising: an input stage comprising a transmitter of an opto-isolator; and an output stage comprising: a receiver of the opto-isolator; an active circuit in series with the receiver between the receiver and a power rail of the output stage; a first resistor connected to an output of the active circuit, and an input for the application of a predetermined voltage to the active circuit, the output stage being configured such that a varying output voltage is developed across the first resistor in response to input of a high voltage AC signal to the input stage. Ideally the output stage is operable to clamp the voltage across the receiver at the level of the predetermined voltage, thereby allowing for an increase in the load resistor and variable output resistor without increasing the time constant to unacceptably having regards to switching requirements.

20 Claims, 5 Drawing Sheets

Fig. 1

PRIOR ART

PRIOR ART

ELECTRICAL ISOLATOR CIRCUIT

FIELD OF THE INVENTION

The present invention relates to a low power electrical isolator circuit operable to provide isolation of a low voltage circuit from a high voltage circuit whilst providing for coupling of an analogue signal from the high voltage circuit to the low voltage circuit.

BACKGROUND TO THE INVENTION

Mains voltage powered consumer products, such as multimedia home networking nodes, are required for reasons of safety to have electrical isolation between mains voltage circuitry and low voltage circuitry. Despite the electrical isolation there is often a need to convey signals across the electrical isolation barrier between the mains voltage circuitry and the low voltage circuitry. The determination of a location, such as a zero crossing point, on the mains voltage signal from the low voltage side is an example of such a need involving the conveyance of signals from the high voltage side to the low voltage side. The determination of a location on the mains voltage signal finds application, for example, in providing for synchronisation with a mains voltage cycle. Synchronisation with the mains voltage cycle may be used to provide for synchronised communication between and amongst low voltage circuits of multiple networked products, such as multimedia home networking nodes. The determination of a location on the mains voltage signal may also find application in monitoring the phase variation of a mains supply to determine whether or not the mains supply is liable to fail. For example, there may be an increased likelihood of failure in supply if there is more than a 2% deviation in the phase of a mains supply from a twenty-four hour mean. Precautionary measures may then be taken, such as the engagement of an uninterruptable power supply.

Figure 1:
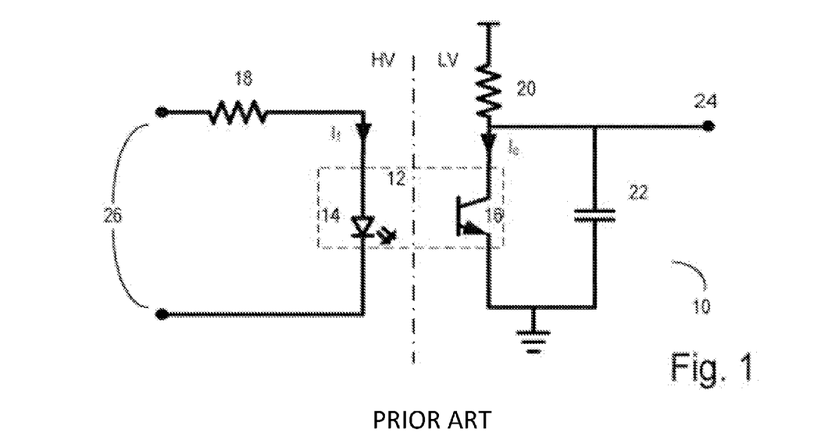
FIG. 1 is a circuit diagram of a known electrical isolator circuit.
Figure 2:
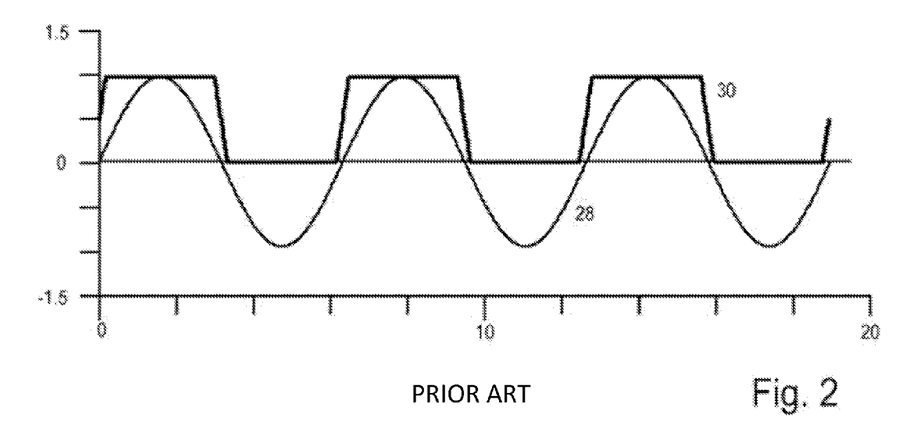
FIG. 2 is a graphical representation of input and output voltages from the electrical isolator circuit of FIG. 1.

A known electrical isolator circuit 10 for conveying signals from a mains voltage circuit to a low voltage circuit whilst maintaining isolation between the mains and low voltage circuits is shown in FIG. 1. The electrical isolator circuit 10 comprises an opto-isolator 12 having an infrared light emitting diode (LED) 14 and a photo-transistor 16. A resistor, 18 in series with the LED 14 limits the current flowing through the LED 14. A load resistor, 20 is present in series with the photo-transistor 16 between the photo-transistor and the positive power line. A capacitor, capacitor 22, represents a parasitic capacitance of the electrical circuit connected to the output 24 of the photo-transistor. In use, a high voltage AC signal is applied across the inputs 26 to the electrical isolator circuit to thereby cause operation of the LED 14. Light emitted by the LED is received by the photo-transistor and causes a current to flow in the photo-transistor with the current developed across the load resistor to thereby provide a corresponding voltage at the output 24. A representative high voltage AC signal 28 is shown in FIG. 2 along with a corresponding output voltage 30 from a zero-crossing detector that takes as its input the voltage signal from the output 24.

A disadvantage of the electrical isolator circuit of FIG. 1 is its high power dissipation on the low voltage side and, in particular, on the high voltage side. The temporal accuracy of the output 24 depends on the speed at which the isolator circuit 10 is capable of switching with the switching speed being determined by the RC time constant of resistor 20 and capacitance 22. The maximum value of resistor 20 can be determined for a given load and a desired accuracy. The maximum value of resistor 20 and the required voltage swing in turn determine the minimum required photo-transistor current, Ic. The LED forward current, If, is then determined on the basis of the current transfer ratio (CTR) of the opto-isolator having regards to the photo-transistor current, Ic. For high voltage signals, most of the voltage is dropped across resistor 18. A power dissipation of 0.5 Watts can be expected for a typical opto-isolator and typical values for resistor 20 and resistor 18. If the forward current, If, is reduced to a significant extent to reduce the power dissipation there is not only a corresponding reduction in the photo-transistor current but also a reduction in the current transfer ratio of the opto-isolator. The combination of these effects results in a much more significant reduction in the output swing, which necessitate an increase in resistor 20, which in turn decreases the switching speed of the isolator circuit by a corresponding amount. Hence, the electrical isolator circuit of FIG. 1 presents an unacceptable compromise between power dissipation and switching speed.

The present invention has been devised in the light of the above mentioned problem with the known electrical isolator circuit.

It is therefore an object for the present invention to provide an improved electrical isolator circuit that is operable to isolate a low voltage circuit from a high voltage circuit whilst providing for coupling of a signal from the high voltage circuit to the low voltage circuit.

It is a further object for the present invention to provide an improved electrical isolator circuit comprising an opto-isolator that is operable to isolate a low voltage circuit from a high voltage circuit whilst providing for coupling of a signal from the high voltage circuit to the low voltage circuit.

Statement of Invention

According to a first aspect of the present invention there is provided an electrical isolator circuit comprising:

an input stage comprising a transmitter of an opto-isolator, the input stage being configured to receive a high voltage AC signal; and an output stage operable at a low voltage, the output stage comprising: a receiver of the opto-isolator; an active circuit in series with the receiver between the receiver and a power rail of the output stage; and a first resistor connected to an output of the active circuit, a predetermined voltage being applied at an input of the active circuit, and the output stage being configured such that a varying output voltage is developed across the first resistor in response to input of a high voltage AC signal to the input stage.

In use, the application of the predetermined voltage to the input of the active circuit maintains a substantially constant voltage across the receiver. The output stage may be configured such that the voltage across the receiver is maintained substantially constant at the predetermined voltage. Hence, the effect of the pole created by the load resistance and the load capacitance is substantially removed to thereby allow for an increase in load resistance without increasing the time constant to an unacceptable extent having regards to switching requirements. Therefore, input resistance can be increased to reduce the forward current, $I_f$, flowing through the LED to thereby reduce the power dissipation. As regards the effect on the varying output voltage, the output stage may be configured such that the varying output voltage is level shifted by a voltage corresponding to the predetermined voltage.

More specifically, the active circuit and the receiver may be in a high side configuration. Thus, the active circuit may be in series between the receiver and a positive power rail of the output stage.

Alternatively or in addition, the active circuit may have first and second inputs, the first input forming an electrical connection for the series connection of receiver and active circuit, and the second input receiving the predetermined voltage.

Alternatively or in addition, the active circuit may have an impedance lower than an impedance of the receiver. More specifically, the impedance of the receiver may be at least substantially two times higher than the impedance of the active circuit. More specifically, the impedance of the receiver may be at least substantially five times higher than the impedance of the active circuit, such as substantially ten times higher.

In a first form, the active circuit may comprise an active load transistor. More specifically, the receiver may be a phototransistor and the active load transistor and the first resistor may be in a cascode (or common gate) configuration with the first resistor operating as a resistive load.

In a second form, the active circuit may comprise a differential amplifier having a first input that is electrically connected to an output of the receiver (e.g. collector or emitter where the receiver is a photo-transistor) and a second input that is connected to a predetermined voltage, the first resistor being connected between an output and the first input of the differential amplifier. The differential amplifier may be comprised in an operational amplifier. More specifically, the first input of the differential amplifier may be an inverting input.

Alternatively or in addition, the active circuit may be configured to operate in saturation. Hence, the varying output voltage may have the form of a digital signal or may have a generally square wave form.

More specifically, the electrical isolator circuit may further comprise a bistable circuit, such as a latch, an output from the active circuit being provided to an input of the bistable circuit. Hence, the bistable circuit may be operative to provide a digital signal that may be operated upon to provide zero-crossing information.

Alternatively or in addition, the output stage may be configured such that the varying output voltage is an analogue output voltage and the electrical isolator circuit may further comprise a signal determining circuit that is electrically connected to the output of the active circuit and that is operative to determine a location on the analogue output voltage. For example, where the active circuit comprises an operational amplifier, the operational amplifier may be configured such that it is not operating in saturation to thereby provide an analogue output voltage, i.e. a voltage that is not either digital in form or generally square wave in form.

More specifically, the signal determining circuit may be configured for operation as a voltage level crossing detector.

More specifically, the signal determining circuit may be configured to compare the analogue output voltage with a reference voltage. The reference voltage may be of a level such that the signal determining circuit is operative to determine a location on the analogue output signal corresponding to a zero crossing point. The reference voltage may correspond to a predetermined voltage applied at an input of the active circuit such that the signal determining circuit operates as a zero crossing detector. The electrical isolator circuit may be configured to adjust the reference voltage of the signal determining circuit in dependence on a value of the output voltage. Thus, the reference voltage may be changed when the RMS voltage of the high voltage AC signal is changed or during calibration to compensate for electrical device parameter variations.

Alternatively or in addition, the first resistor may comprise a variable resistor and the electrical isolator circuit may comprise a gain feedback circuit that is operable to vary a resistance of the variable resistor in dependence on the varying output voltage. The gain feedback circuit may be operable to vary a resistance of the variable resistor in dependence on a value in the varying output voltage. A value, such as a peak value, of the varying output voltage may be determined by means of an analogue to digital converter or a peak detect circuit. In use, the variable resistor and the gain feedback circuit may be used to accommodate a change in the RMS voltage of the high voltage AC signal applied to the input stage or during calibration to compensate for electrical device parameter variations. For example, if the high voltage AC signal is increased from 90 VRMS to 240 VRMS, a value, such as the peak of the varying output voltage, may be determined and the gain feedback circuit may be operable to reduce the resistance of the variable resistor. The variable resistor and the gain feedback circuit may provide an alternative to adjusting the reference voltage of the signal determining circuit when the RMS voltage of the high voltage AC signal is changed.

Alternatively or in addition, a low voltage in the context of the present invention may be a voltage of less than 50 VRMS or a DC voltage of less than 120 V according to standards defined by the International Electrotechnical Commission. More specifically, the low voltage signal may be a DC voltage of less than substantially 15 volts, such as a voltage of 12 volts. More specifically, the low voltage signal may be a DC voltage of substantially 5 volts or less. Alternatively or in addition, a high voltage AC signal in the context of the present invention may be an AC voltage of 50 VRMS or greater according to standards defined by the International Electrotechnical Commission. Alternatively or in addition, the input stage may be configured to receive a high voltage AC signal having a frequency of less than 500 Hz, such as a frequency of substantially 60 Hz or substantially 50 Hz for domestic mains or a frequency of substantially 400 Hz for mains in ships.

In a form and where the electrical isolator circuit comprises a signal determining circuit, the signal determining circuit may comprise a comparator, with the varying output voltage being received at a first input of the comparator and the reference voltage provided at a second input of the comparator. The reference voltage may, for example, be set at a particular voltage level to determine when the varying output voltage passes 1.5 volts as it increases from less than 1.5 volts to more than 1.5 volts. The electrical isolator circuit may be operative to determine a zero crossing point on the high voltage AC signal in dependence on a known time period between the zero-crossing point and the point where the varying output voltage passes the reference voltage. Where the reference voltage is set at a level corresponding to zero volts, the comparator may function as a zero crossing detector.

In another form and where the electrical isolator circuit comprises a signal determining circuit, the signal determining circuit may comprise an analogue-to-digital converter and digital processing circuitry, e.g. embodied in a microprocessor, which are operative to respectively convert the varying output voltage to a digital value and to compare the digital value with a reference value. The reference value may correspond to the reference voltage, e.g. 1.5 volts, or the reference value may correspond to zero volts where a zero crossing function is required.

Alternatively or in addition, the input stage may further comprise a second resistor, the transmitter and second resistor being electrically connected in series. A resistance of the second resistor may be selected to limit a current passing through the transmitter.

Alternatively or in addition, the transmitter may comprise a Light Emitting Diode (LED). The LED may be an infrared LED.

Alternatively or in addition, the receiver may comprise a photo-detector, such as a photo-transistor.

Alternatively or in addition, the output stage may comprise a current source in parallel with the receiver, the current source being operative to provide current in an opposite direction to the receiver. The current source may be configured to compensate for dark current flowing in the photo-transistor. The current source may be variable and the electrical isolator circuit may further comprise a feedback circuit that is operative to control a current of the variable current source in dependence upon a signal received from the output of the active circuit. The feedback circuit may be operative during part of a cycle of the high voltage AC signal, such as during a negative cycle of the high voltage AC signal when the opto-isolator is off. Thus, the variable current source and the feedback circuit may be used to compensate for a variation in the dark current that may flow in the opto-isolator.

Alternatively or in addition, the input stage may comprise a diode in parallel with the transmitter. Where the transmitter comprises an LED, the diode and LED may be electrically connected anode to cathode. In use, the diode may be operative to reduce the likelihood of damage to the transmitter, e.g. as a result of application of mains voltage across the transmitter.

Alternatively or in addition, the input stage may comprise a diode in series with the transmitter. Where the transmitter comprises an LED, the diode and the LED may be electrically connected cathode to anode. In use, the diode may limit the reverse bias voltage across the LED to allow for transmission by the LED of only part of the high voltage AC signal, thereby providing for a reduction in the power consumption of the output stage.

Alternatively or in addition, the transmitter may comprise two back to back LEDs. In use, the back to back LEDs may provide for full-wave transmission of the high voltage AC signal.

The electrical isolator circuit may be integrated in a same integrated circuit die as a circuit comprising the electrical isolator circuit, e.g. a circuit forming part of a home networking node.

According to a second aspect of the present invention, there is provided an electrical isolator circuit comprising:
an input stage comprising a transmitter of an isolator, the input stage being configured to receive a high voltage AC signal; and
an output stage operable at a low voltage, the output stage comprising: a receiver of the isolator; an active circuit in series with the receiver between the receiver and a power rail of the output stage; and a first resistor connected to an output of the active circuit, a predetermined voltage being applied at an input of the active circuit, and the output stage being configured such that a varying output voltage is developed across the first resistor in response to input of a high voltage AC signal to the input stage.

More specifically, the isolator may comprise an opto-isolator.

Further embodiments of the second aspect of the present invention may comprise one or more features of the first aspect of the present invention.

BRIEF DESCRIPTION OF DRAWINGS

Further features and advantages of the present invention will become apparent from the following specific description, which is given by way of example only and with reference to the accompanying drawings, in which.

Figure 3:
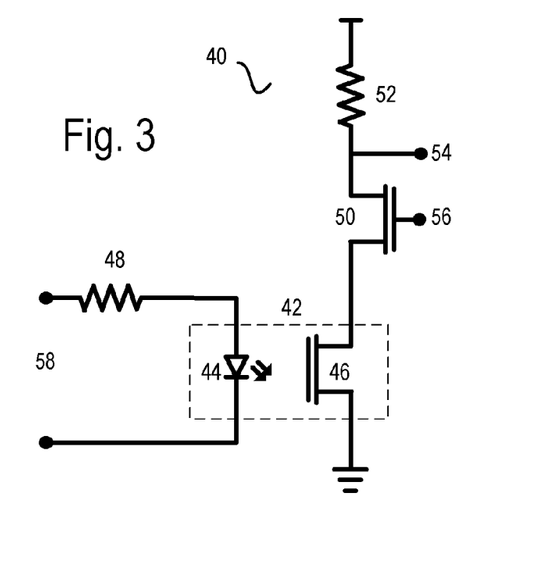
FIG. 3 is a partial circuit diagram of a first embodiment of an electrical isolator circuit according to the present invention.

A first embodiment of an electrical isolator circuit 40 according to the present invention is shown in FIG. 3. In common with the known circuit of FIG. 1, the electrical isolator circuit 40 comprises an opto-isolator 42 having an infrared light emitting diode (LED) 44 and a photo-transistor 46. An input resistor, input resistance, 48 in series with the LED limits the current flowing through the LED. A high voltage AC signal is applied at the input 58 between the input resistor 48 and the cathode of the LED 44. The electrical isolator circuit 40 also comprises a FET transistor 50 (which constitutes an active circuit) in series with a load resistor, 52 between the photo-transistor 46 and the positive power rail in a high sided, common gate configuration. The electrical connection between the FET transistor and the load resistor defines an output connection 54 and a reference voltage (which constitutes a predetermined voltage) is applied to the gate 56 of the FET. Although not shown in FIG. 3, the electrical isolator circuit 40 also comprises a zero-crossing detector, which is operative to detect locations on the signal at the output 54 that correspond to zero-crossings on the high voltage AC signal applied to the input 58 of the electrical isolator circuit 40. The zero-crossing detector is described below with reference to FIG. 6.

Figure 4:
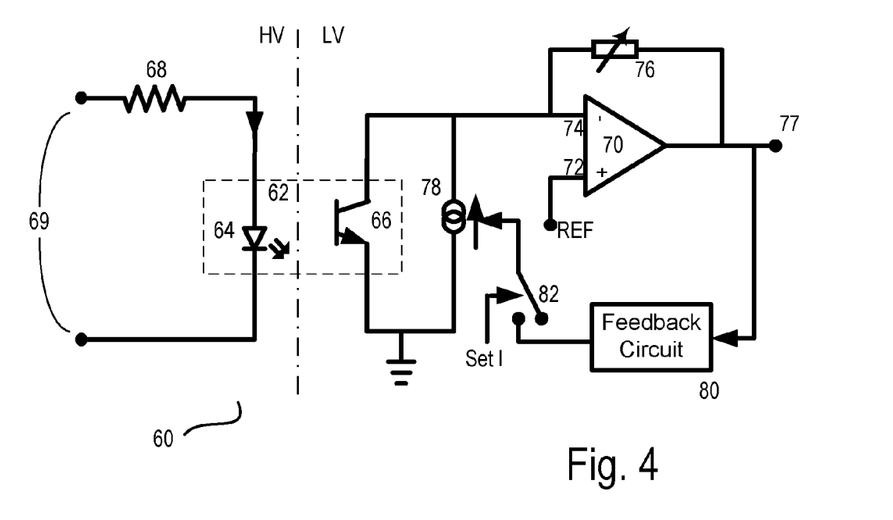
FIG. 4 is a partial circuit diagram of a second embodiment of an electrical isolator circuit according to the present invention.

A second embodiment of an electrical isolator circuit 60 according to the present invention is shown in FIG. 4. In common with the known circuit of FIG. 1, the electrical isolator circuit 60 comprises an opto-isolator 62 having an infrared light emitting diode (LED) 64 and a photo-transistor 66. An input resistor, 68 in series with the LED limits the current flowing through the LED. A high voltage AC signal is applied at the input 69 between the input resistor 68 and the cathode of the LED. The electrical isolator circuit 60 also comprises an operational amplifier 70 (which constitutes an active circuit) having a non-inverting input 72 (which constitutes a first input), which is tied to a reference voltage (which constitutes a predetermined voltage), and an inverting input 74 (which constitutes a second input), which is electrically connected to one side of a variable output resistor 76 and to the collector of the photo-transistor 66. The other side of the variable output resistor 76 is connected to the output 77 of the operational amplifier. The operational amplifier 70 and the photo-transistor 66 are in a high sided configuration.

In accordance with normal design practice, the first stage of the operational amplifier 70 comprises a differential amplifier. The configuration of the electrical isolator circuit is such that the operational amplifier is in series with the photo-transistor between the photo-transistor and the positive power rail with, for example, an electrical path being defined from the collector of the photo-transistor to the inverting input of the differential amplifier (comprised in the operational amplifier) and up through one leg of the differential amplifier to the positive power rail. The electrical isolator circuit 60 also comprises a variable current source 78 in parallel with the photo-transistor, which is operative to source current in an opposite direction to current flow in the photo-transistor, and a feedback circuit 80, which is operative to receive a voltage from the output 77 of the operational amplifier and to control the current flowing through the variable current source 78 in dependence on the received voltage. A switch 82 is present at the output of the feedback circuit 80. The variable current source 78, the feedback circuit and the switch 82 are operative to compensate for opto-isolator dark current as described below. Although not shown in FIG. 4, the electrical isolator circuit 60 also comprises a zero-crossing detector, which is operative to detect locations on the signal at the output 77 that correspond to zero-crossings on the high voltage AC signal applied to the input 69 of the electrical isolator circuit 60. The zero-crossing detector is described below with reference to FIG. 6.

The operation of the electrical isolator circuits 40, 60 of FIGS. 3 and 4 will now be described with reference to FIG. 5A. A high voltage AC signal, such as a mains voltage signal of 240 VRMS, is applied to the input 58, 69 of the electrical isolator circuit 40, 60. The opto-isolator 42, 62 operates as described above with reference to FIG. 1 with the exception that a much lower forward current flows through the LED 44, 64 of the opto-isolator 42, 62 on account of the operation of the active circuit 50, 70 on the low voltage side of the electrical isolator circuits 40, 60. More specifically, a forward current (i.e. high voltage side current) of 15 μA RMS flows in the electrical isolator circuits 40, 60 of FIGS. 3 and 4 whereas a forward current (i.e. high voltage side current) of 2 mA RMS flows in the electrical isolator circuit of FIG. 1.

In each of the electrical isolator circuits 40, 60 of FIGS. 3 and 4 the load resistor 20 of the known electrical isolator circuit of FIG. 1 is replaced with an active circuit that is configured to clamp the voltage across the photo-transistor 46, 66 to the reference voltage. In the circuit of FIG. 3 the active circuit is the FET transistor 50 and in the circuit of FIG. 4 the active circuit is the operational amplifier 70. The current flowing through the photo-transistor in response to current flowing through the LED is developed across the load resistor 52 of the circuit of FIG. 3 and the variable output resistor 76 of the circuit of FIG. 4. The clamping of the voltage across the photo-transistor 46, 66 substantially removes the effect of the pole created by the load resistor 20 and load capacitance 22 in the circuit of FIG. 1 to thereby allow for an increase in the load resistor 52 and variable output resistor 76 without increasing the time constant to an unacceptable extent having regards to switching requirements. Therefore, the value of the input resistor 48, 68 can be increased to reduce the forward current, $I_f$, flowing through the LED to thereby reduce the power dissipation.

Figure 5A:
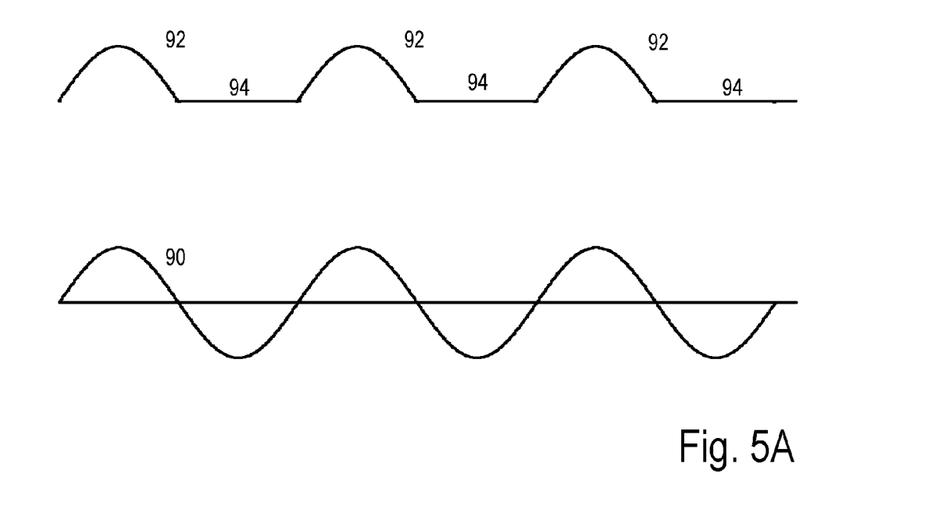
FIG. 5A is a graphical representation of input and output voltages for the electrical isolator circuit of FIG. 4.

The lower graph of FIG. 5A represents the mains voltage signal 90 applied to the input 58, 69 of the electrical isolator circuits 40, 60. The upper graph of FIG. 5A is the voltage signal seen at the output 54, 77 from the electrical isolator circuits 40, 60 with the half wave components 92 representing the varying voltage developed across the load resistor 52 or the variable output resistor 76 in response to coupling of the high voltage AC signal by the opto-isolator 42, 62 and the voltage offset 94 representing the level shift provided by the reference voltage. Returning to the circuit of FIG. 4, compensation for opto-isolator dark current is achieved by means of the variable current source 78, the feedback circuit and the switch 82. Switch 82 operative such that it is closed during negative cycles of the high voltage AC signal applied to the input 69 of the electrical isolator circuit and open during positive cycles of the high voltage AC signal. Hence, the feedback circuit 80 is operative to change the current of the variable current source 78 only when the opto-isolator is off and the dark current is flowing in the phototransistor 66. Changing the current of the variable current source 78 in this "on the fly" fashion provides for compensation for changes in dark current caused by changing temperature, etc.

Figure 5B:
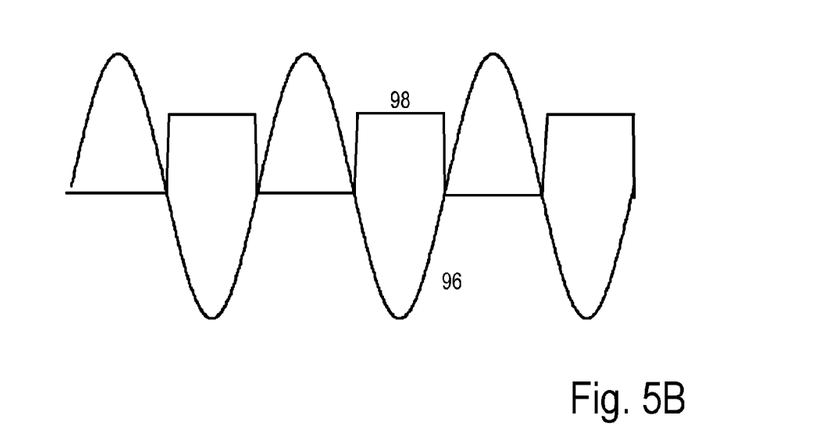
FIG. 5B a graphical representation of input and output voltages for the electrical isolator circuit of FIG. 4 when the amplifier is operated in saturation.

A graphical representation of input 96 and output 98 voltages for the electrical isolator circuit of FIG. 4 when the amplifier 70 is configured to operate in saturation is shown in FIG. 5B. As shown by FIG. 5B operation of the amplifier 70 in saturation causes the amplifier output voltage 98 to describe a generally square wave path in response to application of a high voltage AC signal 96 to the input of the electrical isolator circuit. The output voltage 98 of the amplifier is input to a latch or similar such circuit to provide a regular digital signal, which is suitable for digital processing. Thus and when the amplifier 70 is operated in saturation, the circuit of FIG. 4 provides a digital output signal that can be processed to obtain zero-crossing information and without the use of a comparator or analogue-to-digital converter as is described below with reference to FIGS. 6, 7 and 8.

Figure 6:
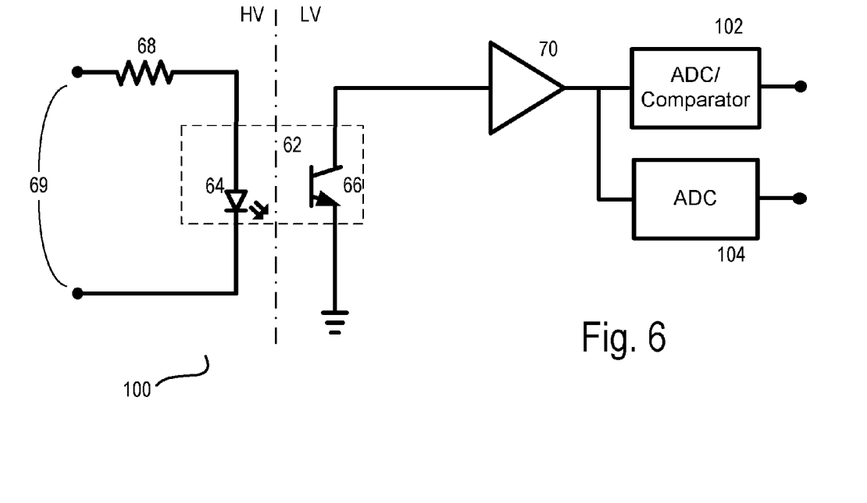
FIG. 6 is a circuit diagram of a third embodiment of an electrical isolator circuit according to the present invention.

FIG. 6 is a circuit drawing of an electrical isolator circuit 100 comprising the electrical isolator circuit of either FIG. 3 or FIG. 4 and an analogue to digital converter/comparator 102 and an analogue to digital converter 104. As stated in the immediately preceding paragraph, an analogue to digital converter/comparator is required when the amplifier 70 of the circuit of FIG. 4 is not operating in saturation. Returning to FIG. 6, the reader's attention is directed to the descriptions provided for the circuits of FIGS. 3 and 4 with components in common being designated in FIG. 6 with the reference numerals used in FIG. 4. Each of the analogue to digital converter/comparator 102 and the analogue to digital converter 104 is connected to the output from the active circuit 70. The digital converter/comparator 102 is operative to function as a comparator. Where the digital converter/comparator 102 has the form of a comparator per se, the output from the active circuit is compared with a reference voltage, with the value of the reference voltage selected so as to correspond to a voltage level on the high voltage AC signal applied to the input 69 of the electrical isolator circuit that is offset by a known amount of time (i.e. a temporal offset) from the zero crossing point. Hence, as the high voltage AC signal crosses through the voltage level the corresponding voltage at the output of the electrical isolator circuit crosses through the reference voltage to cause the comparator to switch and thereby register zero-crossings of the high voltage AC signal; the temporal location of the zero-crossings can be determined because the temporal offset is known. Where the digital converter/comparator 102 has the form of an analogue to digital converter, the analogue to digital converter samples the voltage at the output from the active circuit 70, converts the samples to a digital value and the sampled digital values are compared to the reference voltage in the form of a digital value, e.g. by means of a microprocessor and associated circuitry (not shown), to thereby register zero-crossings of the high voltage AC signal. As mentioned above, registration of zero-crossings may, for example, be used to provide for synchronisation of low voltage circuitry with the mains voltage cycle to in turn provide for synchronised communication between and amongst low voltage circuits of multiple networked products. Alternatively, registration of zero-crossings may be used to monitor the phase of variation of a mains supply to determine whether or not the mains supply is liable to fail. The analogue to digital converter 104 of the electrical isolator circuit 100 of FIG. 6 is operative to continuously sample and convert the output from the active circuit 70 to provide a digital form of the output for analysis purposes, e.g. for curve profiling for diagnostic purposes. Alternatively, the analogue to digital converter 104 is used during a calibration procedure to adjust the level of the reference voltage used by the digital converter/comparator 102 to take account of variations in parameters of electrical devices in the electrical isolator circuit or to take account of changes in the RMS voltage level of the high voltage AC signal applied to the input of the electrical isolator circuit. More specifically, where the RMS voltage of the high voltage AC signal is, for example, increased from 90 VRMS to 240 VRMS, the output from the analogue to digital converter is used to increase the level of the reference voltage used by the digital converter/comparator 102 such that the increased level corresponds, taking the temporal offset in account, to the zero-crossing point on the high voltage AC signal applied to the electrical isolator circuit.

Figure 7:
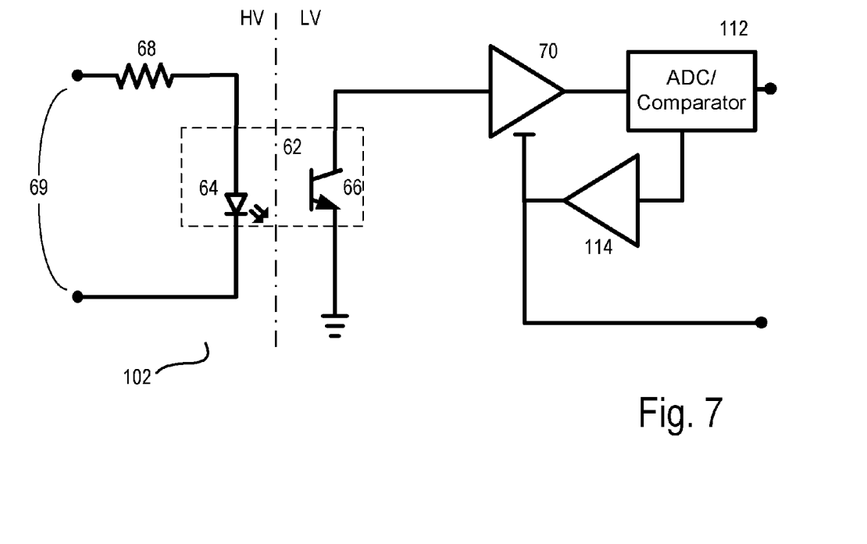
FIG. 7 is a circuit diagram of a fourth embodiment of an electrical isolator circuit according to the present invention.

FIG. 7 is a circuit drawing of an electrical isolator circuit 110 comprising the electrical isolator circuit of either FIG. 3 or FIG. 4 and an analogue to digital converter/comparator 112 and a gain feedback circuit 114. The reader's attention is directed to the descriptions provided for the circuits of FIGS. 3 and 4 with components in common being designated in FIG. 7 with the reference numerals used in FIG. 4. The analogue to digital converter 112 is connected to the output from the active circuit 70 and an input to the gain feedback circuit 114 is connected to an output from the analogue to digital converter 112. An output from the gain feedback circuit 114 is connected to the variable output resistor 76 (see FIG. 4) of the active circuit 70. In use, the analogue to digital converter 112 and the gain feedback circuit 114 are used to vary the resistance of the variable output resistor 76 to change the form of the output signal from the active circuit with respect to the reference voltage used by the analogue to digital converter/comparator 112 to provide for proper registration of zero-crossings in the high voltage AC signal applied to the input of the electrical isolator circuit. The resistance of the variable output resistor 76 may need to be varied to take account of variations in parameters of electrical devices in the electrical isolator circuit or to take account of changes in the RMS voltage level of the high voltage AC signal applied to the input of the electrical isolator circuit. Varying the resistance of the variable output resistor 76 provides an alternative to adjusting the level of the reference voltage used by the digital converter/comparator as described above in the immediately preceding paragraph.

Figure 8:
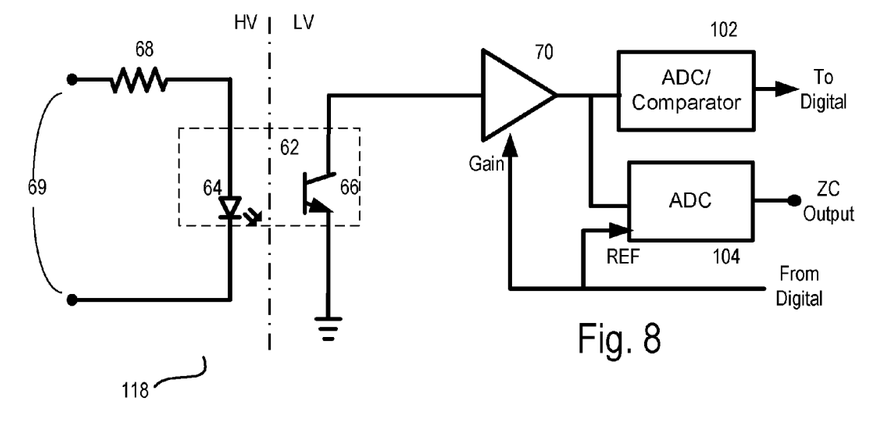
FIG. 8 is a circuit diagram of an electrical isolator circuit according to the invention configured for calibration.

Calibration to take account of variation in component characteristics and in particular variation in the gain (current transfer ratio (CTR)) of the opto-isolator will now be described with reference to FIG. 8. In a batch of opto-isolators the CTR can vary from device to device by as much as a factor of four. FIG. 8 is a circuit drawing of an electrical isolator circuit 118 comprising the components of the electrical isolator circuit 100 of FIG. 6. Therefore, the components of the circuit of FIG. 8 are indicated by reference numerals in common with the circuit of FIG. 6 and the circuits of FIGS. 3 and 4. Reference should be made to the aforegoing description for a description of the form and function of the components of FIG. 8. To calibrate the electrical isolator circuit 118 of FIG. 8 a predetermined voltage that corresponds to a desired output voltage is applied at the input 69. The voltage at the output from the amplifier 70 is sampled and converted by the analogue-to-digital converter 104 to provide a digital output value. The digital output value is then compared with a stored digital value corresponding to the desired output voltage and the gain of the amplifier 70 is adjusted in dependence on the comparison such that the voltage at the output from the amplifier 70 is substantially the same as the desired output voltage.

Figures 9A, 9B:
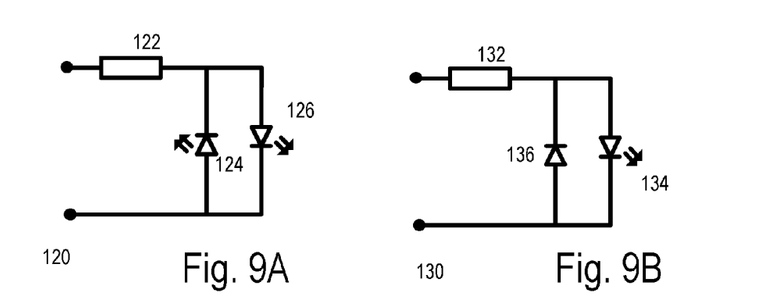
FIGS. 9A, 9B and 9C are three different alternative forms of input stage for any of the first to fourth embodiments.
Figure 9C:
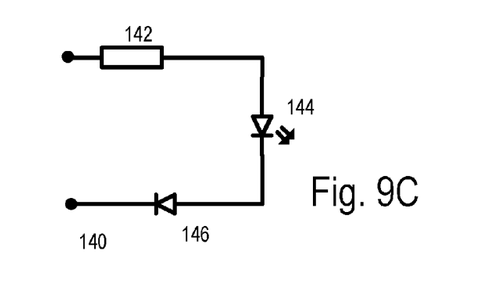

FIGS. 9A to 9C show different configurations of input stage for the electrical isolator circuits described above. The input stage of FIG. 9A comprises an input resistor 122 in series with an opto-coupler comprising two, parallel LEDs 124, 126, which are connected cathode to anode. The LEDs 124, 126 provide for full wave coupling of a high voltage AC signal applied to the input stage of the photo-transistor of the electrical isolator circuit. The input stage 130 of FIG. 9B comprises an input resistor 132 in series with an opto-coupler comprising a single LED 134. A diode 136 is connected in parallel with the LED 134 in an anode to cathode configuration to provide for protection against electrostatic discharge. The input stage 140 of FIG. 9C comprises an input resistor 142 in series with an opto-coupler comprising a single LED 144. A diode 146 is connected in series with the LED 144 in a cathode to anode configuration to provide for transmission by the LED 144 of only part of the high voltage AC signal to thereby reduce power dissipation in the input stage 140.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

The invention claimed is:

1. An electrical isolator circuit comprising:
   an input stage comprising a transmitter of an opto-isolator; and
   an output stage comprising:
      a receiver of the opto-isolator;
      an active circuit in series with the receiver between the receiver and a power rail of the output stage and having an impedance lower than an impedance of the receiver;
      a first resistor connected to an output of the active circuit; and
      an input for the application of a predetermined voltage to the active circuit, the output stage being configured such that a varying output voltage is developed across the first resistor in response to input of a high voltage AC signal to the input stage.

2. An electrical isolator circuit according to claim 1, in which the output stage is configured such that the voltage across the receiver is maintained substantially constant at the predetermined voltage.

3. An electrical isolator circuit according to claim 1, in which the output stage is configured such that the varying output voltage is level shifted by a voltage corresponding to the predetermined voltage.

4. An electrical isolator circuit according to claim 1, in which the active circuit and the receiver are in a high side configuration.

5. An electrical isolator circuit according to claim 1, in which the active circuit has first and second inputs, the first input forming an electrical connection for the series connection of receiver and active circuit, and the second input receiving the predetermined voltage.

6. An electrical isolator circuit according to claim 1, in which the impedance of the receiver is at least substantially two times higher than the impedance of the active circuit.

7. An electrical isolator circuit according to claim 1, in which the active circuit comprises an active load transistor.

8. An electrical isolator circuit according to claim 7, in which the receiver is a phototransistor and the active load transistor and the first resistor are in a cascode configuration with the first resistor operating as a resistive load.

9. An electrical isolator circuit according to claim 1, in which the active circuit is configured to operate in saturation.

10. An electrical isolator circuit according to claim 1, in which the transmitter comprises a Light Emitting Diode (LED).

11. An electrical isolator circuit comprising:
an input stage comprising a transmitter of an opto-isolator; and
an output stage comprising:
a receiver of the opto-isolator;
an active circuit in series with the receiver between the receiver and a power rail of the output stage;
a first resistor connected to an output of the active circuit; and
an input for the application of a predetermined voltage to the active circuit, the output stage configured such that a varying output voltage is developed across the first resistor in response to input of a high voltage AC signal to the input stage; and
a bistable circuit having an input coupled to an output of the active circuit and an output.

12. An electrical isolator circuit according to claim 11, in which the transmitter comprises a Light Emitting Diode (LED).

13. An electrical isolator circuit according to claim 11, in which the active circuit comprises an active load transistor.

14. An electrical isolator circuit comprising:
an input stage comprising a transmitter of an opto-isolator; and
an output stage comprising:
a receiver of the opto-isolator;
an active circuit in series with the receiver between the receiver and a power rail of the output stage;
a first resistor connected to an output of the active circuit;
an input for the application of a predetermined voltage to the active circuit, the output stage configured such that a varying analog output voltage is developed across the first resistor in response to input of a high voltage AC signal to the input stage; and
a signal determining circuit that is electrically connected to the output of the active circuit and that is operative to determine a location on the varying analog output voltage.

15. An electrical isolator circuit according to claim 14, in which the transmitter comprises a Light Emitting Diode (LED).

16. An electrical isolator circuit according to claim 14, in which the active circuit comprises an active load transistor.

17. An electrical isolator circuit according to claim 14, in which the signal determining circuit is configured for operation as a voltage level crossing detector.

18. An electrical isolator circuit according to claim 14, in which the signal determining circuit is configured to compare the analog output voltage with a reference voltage.

19. An electrical isolator circuit comprising:
an input stage comprising a transmitter of an opto-isolator; and
an output stage comprising:
a receiver of the opto-isolator;
an active circuit in series with the receiver between the receiver and a power rail of the output stage;
a variable resistor connected to an output of the active circuit;
an input for the application of a predetermined voltage to the active circuit, the output stage being configured such that a varying output voltage is developed across the variable resistor in response to input of a high voltage AC signal to the input stage; and
a gain feedback circuit that is operable to vary a resistance of the variable resistor in dependence on the varying output voltage.

20. The electrical isolator circuit of claim 19, in which the gain feedback circuit is operable to vary a resistance of the variable resistor in dependence on a value in the varying output voltage, the value of the varying output voltage being determined by at least one of an analogue to digital converter and a peak detect circuit.

* * * * *